United States Patent
Cheng et al.

[19]

[11] Patent Number: 5,970,360
[45] Date of Patent: Oct. 19, 1999

[54] DRAM CELL WITH A ROUGHENED POLY-SI ELECTRODE

[75] Inventors: Huang-Chung Cheng; Han-Wen Liu; Stewart Huang; Roger Yen, all of Hsinchu, Taiwan

[73] Assignee: Mosel Vitelic Inc., Hsinchu, Taiwan

[21] Appl. No.: 08/764,872

[22] Filed: Dec. 3, 1996

[51] Int. Cl.[6] .............................................. H01L 21/8242
[52] U.S. Cl. ..................... 438/398; 438/253; 438/255; 438/396; 438/960; 438/964
[58] Field of Search .................... 438/255, 398, 438/657, 665, 250, 253, 254, 393, 396, 397, 960, 964

[56] References Cited

U.S. PATENT DOCUMENTS

| | | | |
|---|---|---|---|
| 5,494,840 | 2/1996 | Ohmi | 438/253 |
| 5,583,070 | 12/1996 | Liao et al. | 438/398 |
| 5,597,754 | 1/1997 | Lou et al. | 438/398 |
| 5,597,760 | 1/1997 | Hirota | 438/398 |
| 5,607,874 | 3/1997 | Wang et al. | 438/397 |
| 5,637,151 | 6/1997 | Schulz | 134/2 |
| 5,650,351 | 7/1997 | Wu | 438/398 |
| 5,721,153 | 2/1998 | Kim et al. | |
| 5,849,624 | 12/1998 | Fazan et al. | 438/398 |

*Primary Examiner*—Carl Whitehead, Jr.
*Assistant Examiner*—Toniae M. Thomas
*Attorney, Agent, or Firm*—Pennie & Edmonds LLP

[57] ABSTRACT

A porous silicon layer is created by using wet etching to etch a polysilicon layer. In preferred embodiment, the polysilicon layer is treated by $H_3PO_4$ solution at 60–165° C. for about 3–200 minutes. The porous silicon layer is subsequently treated by using a SC-1 solution at a temperature about 50–100° C. for about 5–30 minutes to form a roughened polysilicon layer. The SC-1 solution is composed of $NH_4OH$, $H_2O_2$ and $H_2O$. The volume ratio for the three compounds of said SC-1 is $NH_4OH:H_2O_2:H_2O = 0.1–5:0.1–5:1–20$. The next step of the formation is the deposition of a dielectric film along the roughened surface of the micro-islands polysilicon layers. A conductive layer is deposited over the dielectric film. Next, photolithgraphy and etching process are used to etch the conductive layer, the dielectric film and the micro-islands polysilicon layer into a portion of the layer.

40 Claims, 5 Drawing Sheets

J-V Characteristics of Roughened and Flated Poly-Si Electrodes

TZDB Characteristics of Roughened and Flated Poly-Si Electrodes

DRAM CELL WITH A ROUGHENED POLY-SI ELECTRODE

FIELD OF THE INVENTION

The present invention relates to semiconductor capacitors, and more specifically, to a method of making a capacitor having a roughened poly-Si electrode.

BACKGROUND OF THE INVENTION

The reduction in memory cell area is required for high density DRAM ULSIs. This causes reduction in capacitor area, resulting in the reduction of the capacitance. A memory cell for each bit to be stored by the semiconductor DRAM typically consists of a storage capacitor and an access transistor. Either the source or drain of the transistor is connected to one terminal of the capacitor. The other side of the transistor and the transistor gate electrode are connected to external connection lines called a bit line and a word line, respectively. The other terminal of the capacitor is connected to a reference voltage. Thus, the formation of a DRAM memory cell comprises the formation of a transistor, a capacitor and contacts to external circuits. The capacitor type that is most typically used in DRAM memory cells are planar capacitors, which are relatively simple to manufacture.

In order to achieve high performance (i.e. high density), memory cells in DRAM technology must be scaled down to the submicrometer range. Further, the size of the capacitor decreases, the capacitance of the capacitor also decreases. Similarly, the size of the charge capable of being stored by the capacitor decreases. This results in the capacitor being very susceptible to α particle interference. Additionally, as the capacitance decreases, the charge held by storage capacitor must be refreshed often. A simple stacked capacitor can not provide sufficient capacitance, even with high dielectric $Ta_2O_5$ films as the capacitor insulator.

Prior art approaches to overcom these problems have resulted in the development of the trench capacitor (see for example U.S. Pat. No. 5,374,580) and the stacked capacitor. The trench capacitor has the well-known problem of "gated diode leakage," which is the leakage of current resulting in the trench capacitor failing to hold a charge. Reducing the thickness of the dielectric also can improve the capacitance of the capacitor, but this approach is limited because of yield and reliability problems.

A capacitor-over-bit-line (COB) cell with a hemispherical-grain (HSG) polysilicon storage node has been developed (see "A Capacitor-Over-Bit-Line Cell With Hemispherical-Grain Storge Node For 64 Mb Drams", M. Sakao etc. microelectronics research laboratories, NEC Corporation). The HSG-Si is deposited by low pressure chemical vapor deposition method at the transition temperature from amorphous-Si to polycrystalline-Si. Further, a cylindrical capacitor using Hemispherical-Grained Si has been proposed (see "A New Cylindrical Capacitor Using Hemispherical Grained Si For 256 Mb DRAMs", H. Watanabe et al., Tech Dig, December 1992, pp.259–262).

Another way to form the hemispherical grained Si has been disclosed by M. Yoshimaru (IEEE IEDM-90, p.659) and H. Watanabe et al. (see "J. Appl. Phys. 71(7) p.3538, 1992). The hemispherical grained Si can be formed by using LPCVD at a temperature about 560–600° C. Further, a crown shape capacitor or cylindrical structure have also been disclosed. However, the formation of the cylindrical structure capacitor and the crown shape capacitor are very complex. They also have reliable, stable problems that have to be overcome. In addition, a porous silicon can be formed by using an in-situ doped polysilicon in phosphoric acid solution at 150° C. (H. Watanabe et al, Symposium on VLSI Technology p.17,1993).

SUMMARY OF THE INVENTION

A dielectric layer is formed on a substrate. The dielectric layer is preferably formed of silicon dioxide. A polysilicon layer is subsequently deposited on the dielectric layer by using CVD. Preferably, the second polysilicon layer is composed of two sublayers to prevent the layer from subsequent etching process. The polysilicon layer can be formed by using doped polysilicon, in-situ doped polysilicon. The thickness of the first sublayer is about 1000 angstroms. The second sublayer is subsequently formed on the first sublayer to a thickness about 2000 angstroms.

A porous silicon layer is created by using wet etching to etch the polysilicon layer. In preferred embodiment, the polysilicon layer is treated by $H_3PO_4$ solution at 60–165° C. for about 3–200 minutes. The concentration of the $H_3PO_4$ solution is about 30–90%.

The porous silicon layer is subsequently etched by using SC-1 solution to form a micro-islands polysilicon layer. In the preferred embodiment, the SC-1 solution is composed of $NH_4OH$, $H_2O_2$ and $H_2O$. The volume ratio for the three compounds is $NH_4OH:H_2O_2:H_2O=0.1–5:0.1–5:1–20$. The porous silicon layer 20a is treated in the SC-1 solution at 50–100° C. for about 5–30 minutes.

The next step of the formation is the deposition of a dielectric film along the roughened surface of the micro-islands polysilicon layers. Typically, the dielectric film is preferably formed of either a double film of nitride/oxide film, a triple film of oxide/nitride/oxide, or any other high dielectric constant film such as tantalum oxide ($Ta_2O_5$), BST, PZT.

A conductive layer is deposited over the dielectric film. The conductive layer is used as the top storage node and is formed of doped polysilicon, in-situ doped polysilicon, aluminum, copper, tungsten or titanium. Next, photolithgraphy and etching process are used to etch the conductive layer, the dielectric film and the micro-islands polysilicon layer into a portion of the layer.

The capacitance of the present invention is about 18.17 $fF/\mu m^2$. The effective oxide thickness (Toxeff) is 18.9 angstroms. The leakages of the present invention are 7.24E-8 $A/cm^2$, -3.31E-8 $A/cm^2$ while the bias are 1.65 V and -1.65 V, respectively. The leakages of the present invention can meet the requirements of 256M DRAM.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention relates to a method of making a high dendity memory cell for DRAM, which has an enlargement surface area of the capacitor to increase the performance of the memory cell. Further, the present invention uses a roughened polysilicon as an electrode. As will be seen below, this technique can be used to create a capacitor with micro-islands polysilicon. The detail processes will be described as follows.

Figure 1:
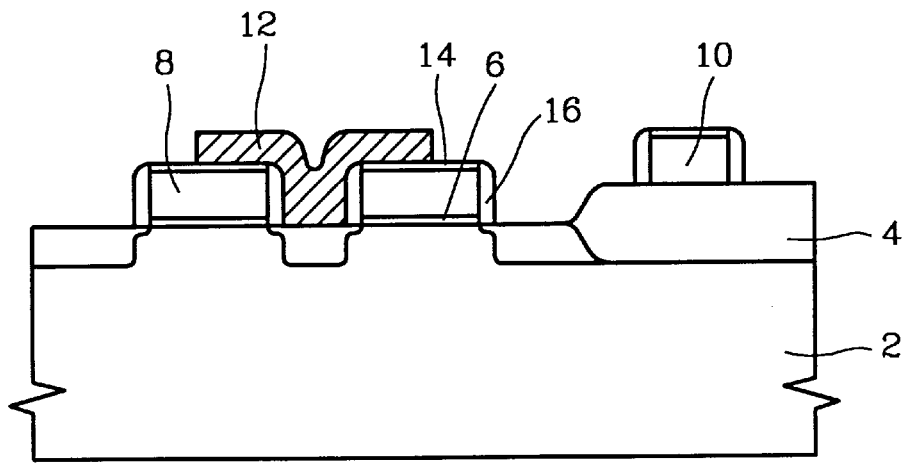
FIG. 1 is a cross section view of a semiconductor wafer illustrating the step of forming a gate structure on a semiconductor substrate.

Referring to FIG. 1, a single crystal P-type substrate 2 with a <100> crystallographic orientation is used for the preferred embodiment. A thick field oxide region 4, FOX 4, is created for the purposes of isolation. Generally speaking, the FOX 4 region is created via photolithography and dry etching steps to etch a silicon nitride-silicon dioxide composite layer. After the photoresist is removed and wet cleaned, a thermal oxidation in a wet oxygen-steam ambient is used to form the FOX 4 region, to a thickness of about 3000–8000 angstroms.

Initially, a silicon dioxide layer 6 is created atop the substrate 2 to use as a gate oxide. In the preferred embodiment, the silicon dioxide layer 6 is formed by using a dry oxygen-steam ambient, at a temperature between about 850 to 1000° C. Alternatively, the gate oxide 6 may be formed using other known oxide chemical compositions and procedures. As is known in the art, the silicon dioxide layer 4 can be formed by using chemical vapor deposition (CVD) process, using TEOS (tetraethylorthosilicate) as a source at a temperature about 650 to 750° C., at a pressure about 1 to 10 torrs. In the preferred embodiment, the thickness of the silicon dioxide layer 6 is approximately 50–200 angstroms.

Still referring to FIG. 1, after the silicon dioxide layer 6 is formed, a first polysilicon layer 8 is formed over the silicon dioxide layer 6 and the field oxide regions 4. In the preferred embodiment, the first polysilicon layer 8 is formed by using conventional chemical vapor deposition (CVD) to have a thickness about 2000–4000 angstroms. Then, a word line 10, a bit line 12, gate structures with cap layer 14, and side wall spacers 16, are formed by well known technology and is not particularly germane to the present invention. Thus, only a cursory description of the formation of gate structure is given here.

Figure 2:
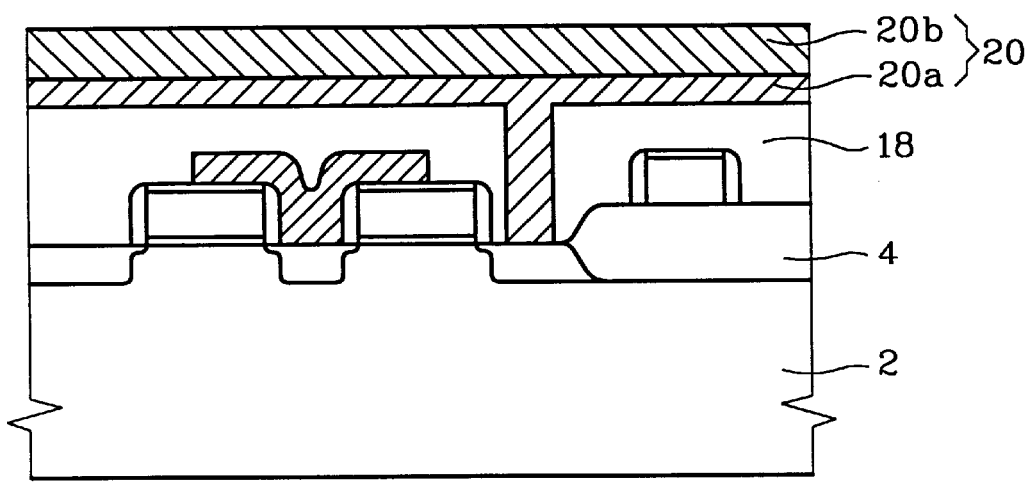
FIG. 2 is a cross section view of a semiconductor wafer illustrating the step of forming a dielectric layer, a polysilicon layer on the semiconductor substrate.

As shown in FIG. 2, a dielectric layer 18 for isolation is formed on the gate structures, FOX 4 and substrate 2 to a thickness about 3000–8000 angstroms. The dielectric layer 18 is preferably formed of silicon dioxide. Then a contact hole is created in the dielectric layer 18 by photolithography and etching. A second polysilicon layer 20 is subsequently deposited on the dielectric layer 18 and in the contact hole by using CVD. Preferably, the second polysilicon layer 20 is composed of two polysilicon sublayers 20a, 20b to prevent the second polysilicon layer 20 from totally being etched away by subsequent etching process. Generally speaking, the subsequent hot phosphoric acid will etch the polysilicon 20 along the grain boundaries of the polysilicon 20. The grain boundaries between the two polysilicon sublayers 20a, 20b are discontinue. Therefore, the two polysilicon sublayers 20a, 20b structure can slow down the etching rate for increasing the process window. Further, a native oxide layer will form between the two polysilicon sublayers, the native oxide is not easy to be removed by the hot phosphoric acid. It can also increase the process window. The second polysilicon layer 20 can be formed using doped polysilicon, in-situ doped polysilicon. First, the thickness of the first sublayer 20a is about 1000 angstroms. The dosage of the first sublayer 20a is about 4E15–1E16 atoms/cm$^2$, and the dopant is phosphorus. Then the first sublayer 20a will be activated at high temperature about 600–1000° C. After the native oxide is removed, the second sublayer 20b is subsequently formed on the first sublayer 20a to a thickness about 1000–3000 angstroms. The dopant is phosphorus and the dosage of the second sublayer 20b is about 4E15–1.2E16 atoms/cm$^2$. Similarily, the second sublayer 20b is also activated at a temperature about 600–1000° C.

Figure 3:
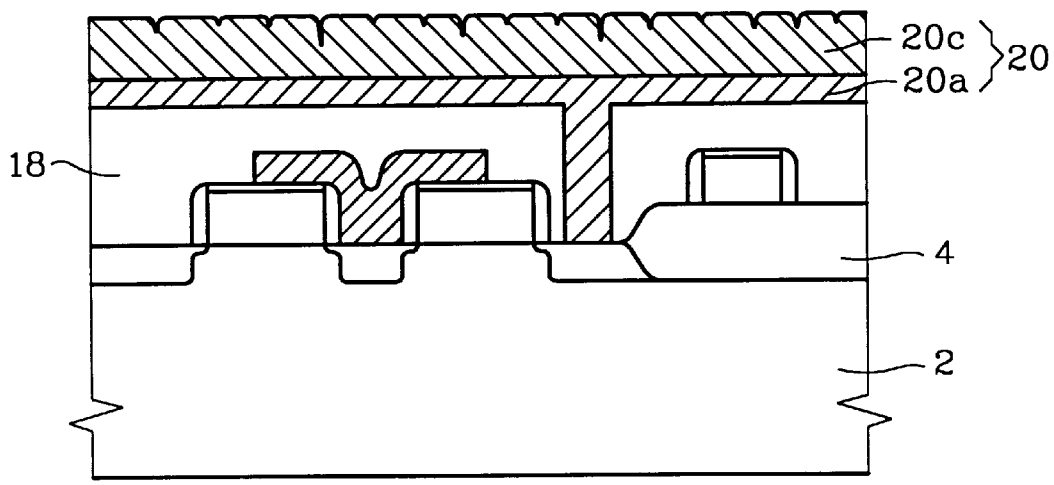
FIG. 3 is a cross section view of a semiconductor wafer illustrating the step of forming a porous polysilicon in accordance with the present invention.

Turning next to FIG. 3, a porous silicon layer 20c is created by using wet etching to etch the second polysilicon layer 20. In the preferred embodiment, the polysilicon layer 20 is treated by hot phosphoric acid ($H_3PO_4$) solution at 60–165° C. for about 3–200 minutes. The silicon grain will become porous while the silicon grain boundary is engraved structure after the wet etching. It is appreciated that any suitable time can be used for the step. The concentration of the $H_3PO_4$ solution is about 30–90%.

Figure 4:
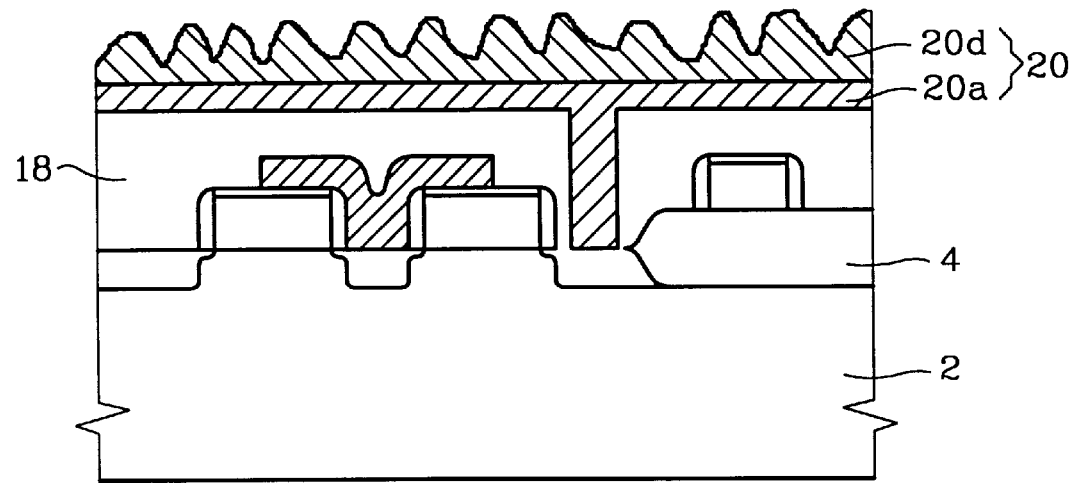
FIG. 4 is a cross section view of a semiconductor wafer illustrating the step of forming a roughened polysilicon in accordance with the present invention.

Turning next to FIG. 4, the porous silicon layer 20c is subsequently etched by using wet etching to form a roughened polysilicon layer 20d with micro-islands on the surface. The key way to form the roughened polysilicon layer 20d is to etch the porous silicon layer 20c by SC-1 solution. In preferred embodiment, the SC-1 solution is composed of $NH_4OH$, $H_2O_2$ and $H_2O$. The volume ratio for the three compounds is $NH_4OH:H_2O_2:H_2O=0.1-5:0.1-5:1-20$. The porous silicon layer is treated in the SC-1 solution at 50–100° C. for about 5–30 minutes. Thus the surface area of the second polysilicon layer 20 is increased due to the flated polysilicon 20 is transferred to the roughened polysiicon layer 20d. Alterntetively, a RCA cleanup procedures can also be used in the process to form the roughened (micro-islands) polysilicon layer 20b. Typically, the RCA cleanup procedures includes three cleanup steps that are $H_2SO_4$ solution ($H_2SO_4:H_2O_2=3:1$), SC-1 and SC-2. The SC-1 is composed of $NH_4OH:H_2O_2:H_2O=1:1:5$. The SC-2 is composed of $HCl:H_2O_2:H_2O=1:1:6$. Further, the three steps of the RCA procedures are changeable in the present invention. In the preferred embodiment, the roughened (micro-islands) polysilicon layer 20b can be formed by using $H_2SO_4$ solution at a temperature about 80–130° C. for about 5–30 minutes, SC-1 at 50–100° C. for 5–30 minutes and SC-2 at 50–100° C. for 5–30 minutes to etch the porous silicon layer 20c, respectively. The roughened polysilicon layer 20d is served as a bottom electrode of a capacitor.

Figure 5:
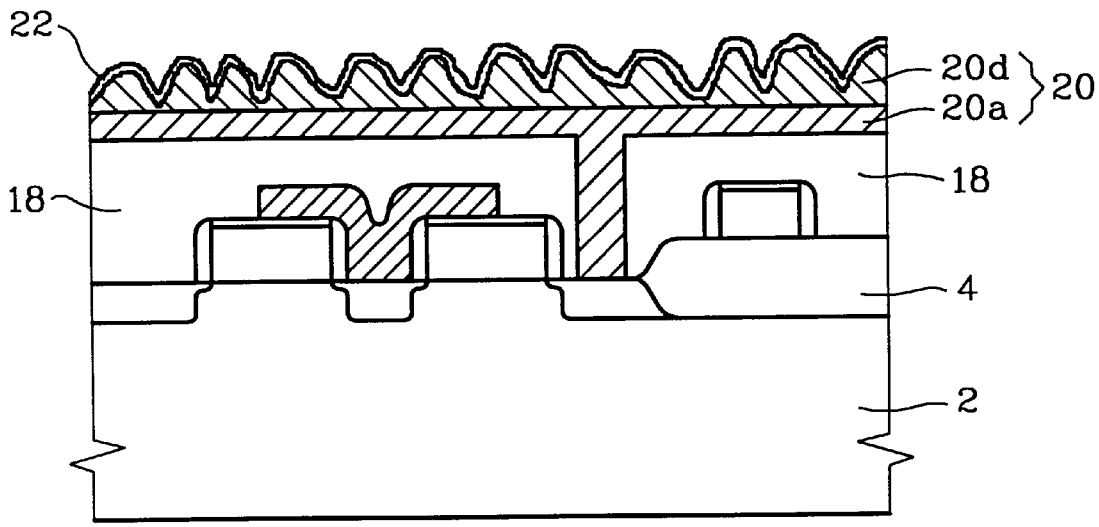
FIG. 5 is a cross section view of a semiconductor wafer illustrating the step of forming a dielectric film on the roughened polysilicon.

Next, referring to FIG. 5, the next step of the formation is the deposition of a dielectric film 22 along the roughened surface of the micro-islands polysilicon layers 20b. Typically, the dielectric film 22 is preferably formed of either a double-film of nitride/oxide film, a triple-film of oxide/nitride/oxide, or any other high dielectric film such as tantalum oxide ($Ta_2O_5$), BST, PZT.

Figure 6:
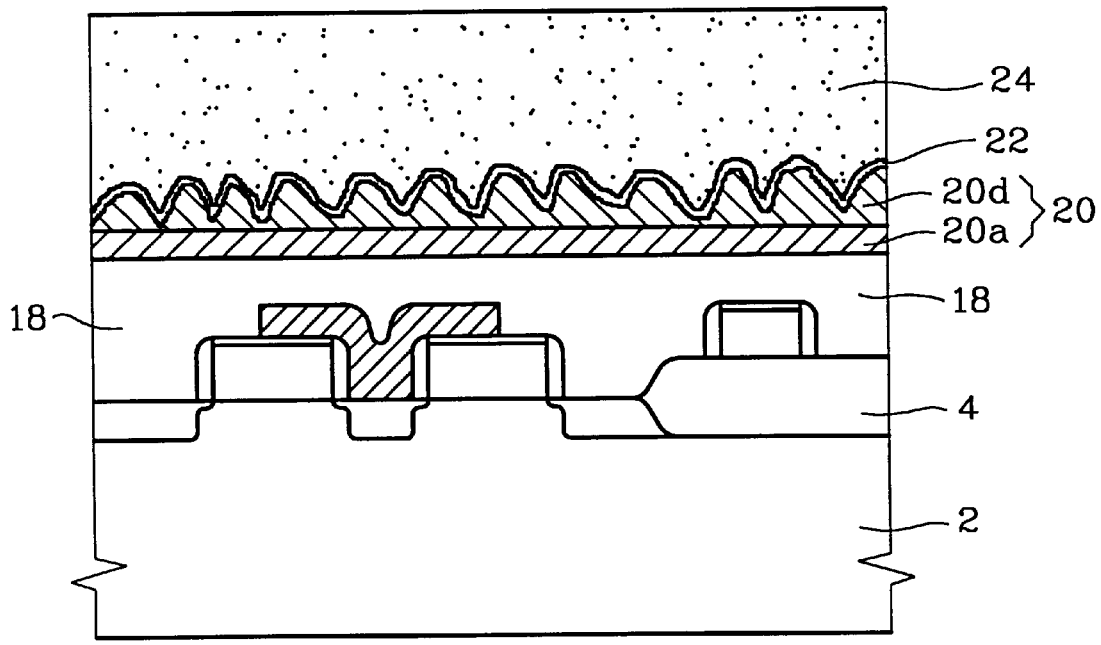
FIG. 6 is a cross section view of a semiconductor wafer illustrating the step of forming a conductive layer on the dielectric film.

Referred to FIG. 6, a conductive layer 24 is deposited over the dielectric film 24. The conductive layer 24 is used as the top storage node and is formed of doped polysilicon, in-situ doped polysilicon, aluminum, copper, tungsten or titanium.

Figure 7:
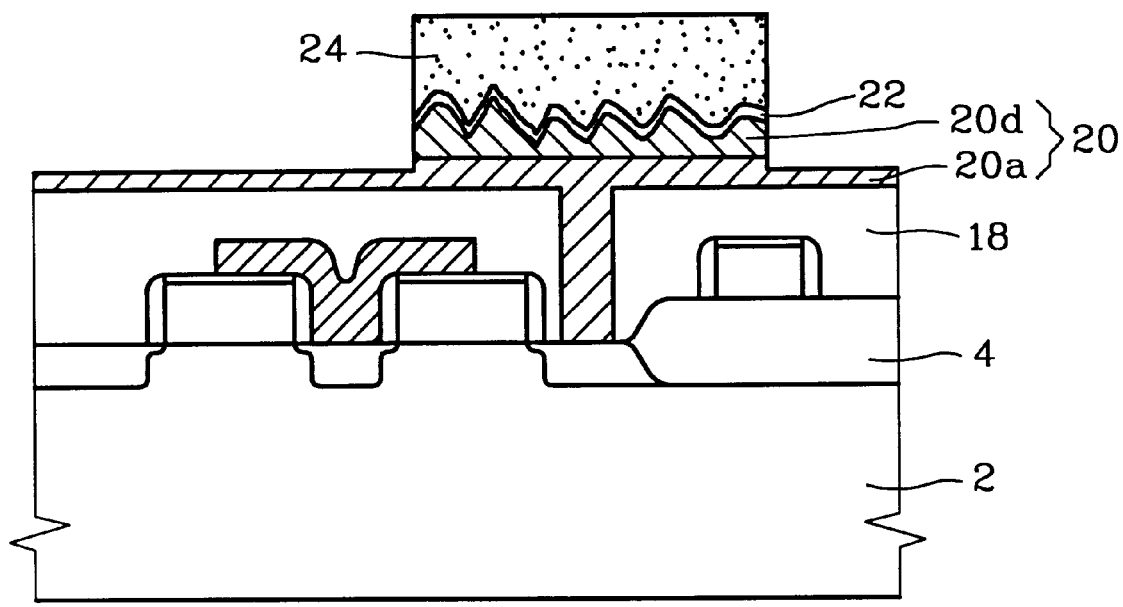
FIG. 7 is a cross section view of a semiconductor wafer illustrating the step of etching the conductive layer, the dielectric film and the roughened polysilicon.

Turning to FIG. 7, photolithgraphy and etching process are used to etch the conductive layer 24, the dielectric film 22 and the roughened polysilicon layer 20b into a portion of the layer 22b. Thus a DRAM cell is formed.

Figure 8:
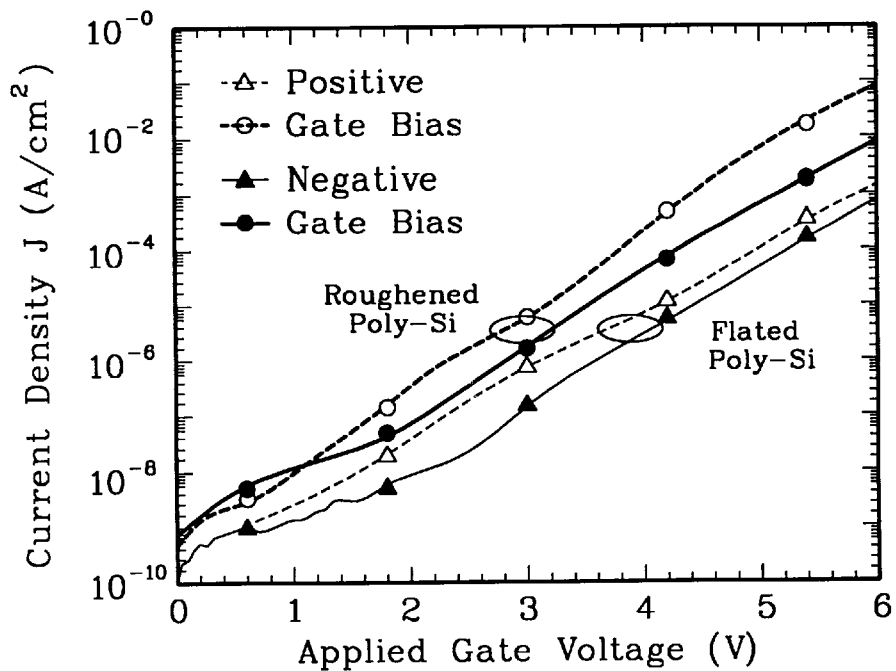
FIG. 8 is the J-V characteristics of the capacitor with the roughened and flated polysilicon electrodes.
Figure 9:
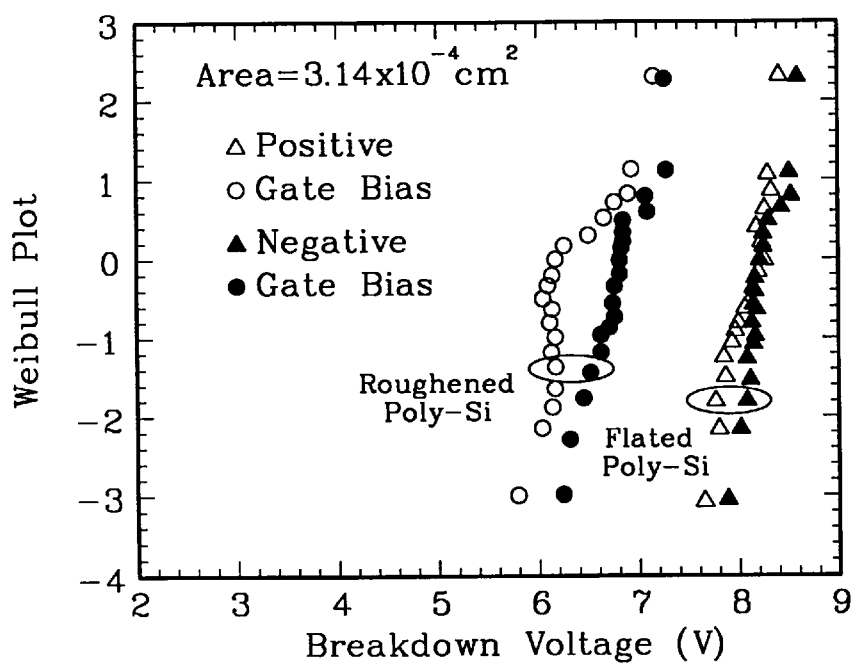
FIG. 9 is TZDB characteristics of the capacitor with the roughened and flated polysilicon electrodes.

The capacitance of the capacitor can be obtain by C-V method. The capacitance of the capacitor with the roughened polysilicon is about 18.17 $fF/\mu m^2$ while the one of the capacitor with the flated polysilicon layer is 5.77 $fF/\mu m^2$. The effective oxide thicknesses (Toxeff) are respectively 18.9 angstroms, 59.5 angstroms for the two type capacitors. That is to say the surface area of the micro-islands polysilicon 20b is 3.15 times of the one of the flated polysilicon 20. FIG. 8 is the J-V characteristics of the capacitors with the roughened and flated polysilicon electrodes, respectively. FIG. 9 is time-zero-dielectric-breakdown (TZDB) characteristics of the capacitors with the roughened and flated polysilicon electrodes, respectively. The Toxeff of the present invention is 18.9 angstroms which can be suitably used in 256M DRAM. Further, the leakages of the present invention are 7.24E-8 $A/cm^2$, −3.31E-8 $A/cm^2$ while the bias are 1.65 V and −1.65 V, respectively. The leakages of the present invention can meet the requirement of 256M DRAM.

As is understood by a person skilled in the art, the foregoing preferred embodiment of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for manufacturing an integrated circuit capacitor, the method comprising the steps of:
    forming a polysilicon layer on a substrate;
    etching said polysilicon layer to form a porous silicon layer;
    etching said porous layer with ($H_2SO_4+H_2O_2$), ($NH_4OH+H_2O_2+H_2O$) and ($HCl+H_2O_2+H_2O$), in any order, to form a roughened polysilicon layer;
    forming a dielectric film on said roughened polysilicon layer;
    forming a conductive layer over said dielectric film; and
    etching said conductive layer, said dielectric film and said roughened polysilicon layer.

2. The method of claim 1, further comprises following steps to form said polysilicon layer:
    forming a first polysilicon sublayer on said substrate; and
    forming a second polysilicon sublayer on said first polysilicon sublayer.

3. The method of claim 2, wherein the dosage of said first polysilicon sublayer is about 4E15–1E16 atoms/$cm^2$, and the dopant is phosphorus.

4. The method of claim 2, wherein said first polysilicon sublayer is activated at a temperature about 600–1000° C.

5. The method of claim 2, wherein the thickness of said first polysilicon sublayer is about 1000 angstroms.

6. The method of claim 2, wherein the dosage of said second polysilicon sublayer is about 4E15–1.2E16 atoms/$cm^2$, and the dopant is phosphorus.

7. The method of claim 2, wherein said second polysilicon sublayer is activated at a temperature about 600–1000° C.

8. The method of claim 2, wherein the thickness of said second polysilicon sublayer is about 2000 angstroms.

9. The method of claim 1, wherein said porous silicon layer is formed by using hot phosphoric acid.

10. The method of claim 9, wherein said porous silicon layer is formed at a temperature about 60–165° C. for about 3–200 minutes.

11. The method of claim 9, wherein the concentration of said hot phosphoric acid is about 30–90%.

12. The method of claim 1, wherein the volume ratio for the three compounds of said SC-1 is $NH_4OH:H_2O_2:H_2O$= 0.1–5:0.1–5:1–20.

13. The method of claim 1, wherein said roughened polysilicon layer is formed at a temperature about 50–100° C. for about 5–30 minutes.

14. The method of claim 1, wherein said roughened polysilicon layer is formed by using said ($H_2SO_4+H_2O_2$) at a temperature about 80–130° C. for about 5–30 minutes, said ($NH_4OH+H_2O_2+H_2O$) at 50–100° C. for 5–30 minutes and said ($HCl+H_2O_2+H_2O$) at 50–100° C. for 5–30 minutes.

15. The method of claim 1, wherein said dielectric film is formed of tantalum oxide($Ta_2O_5$).

16. The method of claim 1, wherein said dielectric film is formed of a triple film of oxide/nitride/oxide.

17. The method of claim 1, wherein said dielectric film is formed of a double film of nitride/oxide film.

18. The method of claim 1, wherein said conductive layer is selected from the group consisting of doped polysilicon, in-situ doped polysilicont, aluminum, copper, tungsten, titanium, and combinations thereof.

19. A method for manufacturing an integrated circuit capacitor, the method comprising the steps of:
    forming a double polysilicon layer on a substrate, said double polysilicon layer comprises a first sublayer and a second sublayer on said first sublayer, wherein the dosage of said first sublayer is about 4E15–1E16 atoms/$cm^2$, and the dopant is phosphorous said first sublayer is activated at a temperature about 600–1000° C., the dosage of said second sublayer is about 4E15–1.2E16 atoms/$cm^2$, and the dopant is phosphorous, said second sublayer is activated at a temperature about 600–1000° C.;
    etching said double polysilicon layer to form a porous silicon layer by using hot phosphoric acid at a temperature about 60–165° C. for about 3–200 minutes, the concentration of said hot phosphoric acid is about 30–90%;
    etching said porous layer to form a roughened polysilicon layer by using a SC-1 solution at a temperature about 50–100° C. for about 5–30 minutes, said SC-1 solution is composed of $NH_4OH$, $H_2O_2$ and $H_2O$, the volume ratio for the three compounds of said SC-1 is $NH_4OH:H_2O_2:H_2O$=0.1–5:0.1–5:1–20;
    forming a dielectric film on said roughened polysilicon layer;
    forming a conductive layer over said dielectric film; and
    etching said conductive layer, said dielectric film and said roughened polysilicon layer.

20. The method of claim 19, wherein said roughened polysilicon layer is formed by also etching with ($H_2SO_4+H_2O_2$) at a temperature about 80–125° C. for about 5–30 minutes, and etching with said ($HCl+H_2O_2+H_2O$) at a temperature about 50–100° C. for about 5–30 minutes.

21. The method of claim 19, wherein said dielectric film is formed of tantalum oxide($Ta_2O_5$).

22. The method of claim 19, wherein said dielectric film is formed of a triple film of oxide/nitride/oxide.

23. The method of claim 19, wherein said dielectric film is formed of a double film of nitride/oxide film.

24. A method of forming a roughened polysilicon electrode comprising the steps of:

forming a polysilicon layer on a substrate;

etching said polysilicon layer to form a porous silicon layer by using hot phosphoric acid at a temperature at least about 60° C. but less than 150° C. for about 3–200 minutes, the concentration of said hot phosphoric acid is about 30–90%; and etching said porous layer to form a roughened polysilicon layer by using a SC-1 solution at a temperature about 50–100° C. for about 5–30 minutes, said SC-1 solution is composed of $NH_4OH$, $H_2O_2$ and $H_2O$, wherein the volume ratio for the three compounds of said SC-1 layer is $NH_4OH:H_2O_2:H_2O=0.1–5:0.1–5:1–20$.

25. A method for manufacturing an integrated circuit capacitor, the method comprising the steps of:

forming a polysilicon layer on a substrate;

etching said polysilicon layer to form a porous silicon layer by using hot phosphoric acid;

etching said porous layer with ($H_2SO_4+H_2O_2$), ($NH_4OH+H_2O_2+H_2O$) and ($HCl+H_2O_2+H_2O$), in any order, to form a roughened polysilicon layer;

forming a dielectric film on said roughened polysilicon layer;

forming a conductive layer over said dielectric film, and etching said conductive layers, said dielectric film and said roughened polysilicon layer.

26. The method of claim 25, wherein said roughened polysilicon layer is formed by using said ($H_2SO_4+H_2O_2$) at a temperature about 80–130° C. for about 5–30 minutes, said ($NH_4OH+H_2O_2+H_2O$) at 50–100° C. for 5–30 minutes and said ($HCl+H_2O_2+H_2O$) at 50–100° C. for 5–30 minutes.

27. The method of claim 25, further comprising the following steps to form said polysilicon layer:

forming a first polysilicon sublayer on said substrate; and forming a second polysilicon sublayer on said first polysilicon sublayer.

28. The method of claim 27, wherein the dosage of said first polysilicon sublayer is about 4E15–1E16 atoms/$cm^2$, and the dopant is phosphorus.

29. The method of claim 27, wherein said first polysilicon sublayer is activated at a temperature of about 600–1000° C.

30. The method of claim 27, wherein the thickness of said first polysilicon sublayer is about 1000 angstroms.

31. The method of claim 27, wherein the dosage of said second polysilicon sublayer is about 4E15–1.2E16 atoms/$cm^2$, and the dopant is phosphorus.

32. The method of claim 27, wherein said second polysilicon sublayer is activated at a temperature of about 600–1000° C.

33. The method of claim 27, wherein the thickness of said second polysilicon sublayer is about 200 angstroms.

34. The method of claim 25, wherein said porous silicon layer is formed at a temperature of about 60–165° C. for about 3–200 minutes.

35. The method of claim 25, wherein the concentration of said hot phosphoric acid is about 30–90%.

36. The method of claim 25, wherein said roughened polysilicon layer is formed at a temperature about 50–100° C. for about 5–30 minutes.

37. The method of claim 25, wherein said dielectric film is formed of tantalum oxide ($Ta_2O_5$).

38. The method of claim 25, wherein said dielectric film is formed of a triple film of oxide/nitride/oxide.

39. The method of claim 25, wherein said dielectric film is formed of a double film of nitride/oxide film.

40. The method of claim 25, wherein said conductive layer is selected from the group consisting of doped polysilicon, in-situ doped polysilicon, aluminum, copper, tungsten, titanium, and combinations thereof.

* * * * *